(12) United States Patent  
Bai

(10) Patent No.: US 10,389,401 B1
(45) Date of Patent: Aug. 20, 2019

(54) MULTI-WAY SWITCH, RADIO FREQUENCY SYSTEM, AND WIRELESS COMMUNICATION DEVICE

(71) Applicant: Guangdong Oppo Mobile Telecommunications Corp., Ltd., Dongguan, Guangdong (CN)

(72) Inventor: Jian Bai, Guangdong (CN)

(73) Assignee: Guangdong Oppo Mobile Telecommunications Corp., Ltd., Dongguan (CN)

( * ) Notice: Subject to any disclaimer, the term of this patent is extended or adjusted under 35 U.S.C. 154(b) by 0 days.

(21) Appl. No.: 16/206,012

(22) Filed: Nov. 30, 2018

(30) Foreign Application Priority Data

Mar. 16, 2018 (CN) .......................... 2018 1 0220722

(51) Int. Cl.
| | |
|---|---|
| *H04B 1/44* | (2006.01) |
| *H04B 1/48* | (2006.01) |
| *H03K 17/687* | (2006.01) |
| *H02J 50/20* | (2016.01) |
| *H02J 7/02* | (2016.01) |
| *H04B 7/0413* | (2017.01) |

(52) U.S. Cl.
CPC ............ *H04B 1/48* (2013.01); *H03K 17/6871* (2013.01); *H02J 7/025* (2013.01); *H02J 50/20* (2016.02); *H04B 7/0413* (2013.01)

(58) Field of Classification Search
None
See application file for complete search history.

(56) References Cited

U.S. PATENT DOCUMENTS

| | | | | |
|---|---|---|---|---|
| 6,397,082 B1 * | 5/2002 | Searle | ................... | H04W 48/12 |
| | | | | 455/562.1 |
| 8,159,394 B2 * | 4/2012 | Hayes | ................... | H01Q 1/246 |
| | | | | 342/368 |

(Continued)

FOREIGN PATENT DOCUMENTS

| | | |
|---|---|---|
| CN | 101867402 A | 10/2010 |
| CN | 202103661 U | 1/2012 |

(Continued)

OTHER PUBLICATIONS

International search report issued in corresponding international application No. PCT/CN2018117708 dated Jan. 30, 2019.

(Continued)

*Primary Examiner* — Tuan A Tran
(74) *Attorney, Agent, or Firm* — Young Basile Hanlon & MacFarlane, P.C.

(57) ABSTRACT

A multi-way switch, a radio frequency system, and a wireless communication device are provided. The multi-way switch includes six T ports and four P ports. The six T ports include two first T ports and each of the two first T ports is coupled with all of the four P ports. The two first T ports support only a transmission function. The multi-way switch is configured to be coupled with a radio frequency circuit and an antenna system of a wireless communication device operable in a dual-frequency dual-transmit mode. The antenna system includes four antennas corresponding to the four P ports.

20 Claims, 11 Drawing Sheets

(56) References Cited

U.S. PATENT DOCUMENTS

| | | | | |
|---|---|---|---|---|
| 8,445,770 | B2* | 5/2013 | Jacob | G10H 1/18 |
| | | | | 326/38 |
| 8,629,813 | B2* | 1/2014 | Milosavljevic | H01Q 1/243 |
| | | | | 343/850 |
| 8,644,271 | B2* | 2/2014 | Rich | H04W 74/06 |
| | | | | 370/328 |
| 9,484,619 | B2* | 11/2016 | Korva | H01Q 1/243 |
| 9,490,863 | B2* | 11/2016 | Dupuy | H04B 1/44 |
| 9,577,691 | B2* | 2/2017 | Hanaoka | H04B 1/006 |
| 9,578,684 | B2* | 2/2017 | Porter | H04W 88/08 |
| 9,602,155 | B2* | 3/2017 | Chartier | H01Q 3/28 |
| 9,717,008 | B1* | 7/2017 | Sharma | H04W 24/06 |
| 9,854,454 | B2* | 12/2017 | Shen | H04W 16/24 |
| 9,906,260 | B2* | 2/2018 | Ramachandran | H04B 1/44 |
| 9,960,802 | B2* | 5/2018 | Ku | H04B 1/48 |
| 10,128,963 | B2* | 11/2018 | Sharma | H04B 17/14 |
| 2009/0054093 | A1 | 2/2009 | Kim et al. | |
| 2013/0308554 | A1 | 11/2013 | Ngai et al. | |
| 2014/0227982 | A1 | 8/2014 | Granger-Jones et al. | |

FOREIGN PATENT DOCUMENTS

| | | |
|---|---|---|
| CN | 103905104 A | 7/2014 |
| CN | 106559277 A | 4/2017 |
| CN | 106685621 A | 5/2017 |
| CN | 108462499 A | 8/2018 |
| CN | 108512556 | 9/2018 |
| CN | 108512568 | 9/2018 |
| WO | 2012109988 A1 | 8/2012 |
| WO | 2015131020 A1 | 9/2015 |

OTHER PUBLICATIONS

Extended European search report issued in corresponding European application No. 18210041.2 dated May 28, 2019.

Gao Xiang et al: "Multi-Switch for Antenna Selection in Massive MIMO", 2015 IEEE Global Communications Conference (GLOBECOM), IEEE, Dec. 6, 2015 (Dec. 6, 2015), pp. 1-6, XP032872922, DOI: 10.1109/GLOCOM.2014.7417765 [retrieved on Feb. 23, 2016], sections I, III.B, III.C, figures 1, 2, 6.

Lemieux G et al: "Generating Highly-Routable Sparse Crossbars for PLDS", FPGA'00. ACM/SIGDA International Symposium on Field Programmable Gate Arrays. Monterey, CA, Feb. 9-11, 2000; [ACM/SIGDA International Symposium on Field Programmable Gate Arrays], New York, NY : ACM, US, vol. Conf. 8, Jan. 1, 2000 (Jan. 1, 2000), pp. 155-164, XP008060160, DOI: 10.1145/329166.329199, ISBN: 978-1-58113-193-2, section 2, figure 1.

* cited by examiner

MULTI-WAY SWITCH, RADIO FREQUENCY SYSTEM, AND WIRELESS COMMUNICATION DEVICE

CROSS-REFERENCE TO RELATED APPLICATION(S)

This application claims priority to Chinese Patent Application No. 201810220722.6, filed on Mar. 16, 2018, the disclosure of which is hereby incorporated by reference in its entirety.

TECHNICAL FIELD

This disclosure relates to the technical field of communication, and more particularly to a multi-way switch, a radio frequency system, and a wireless communication device.

BACKGROUND

With the widespread use of wireless communication devices such as smart phones, the smart phone can support an increasing number of applications and is becoming more and more powerful. The smart phone is developing in a diversified and personalized way, becoming an indispensable electronic product in users' life. In the fourth generation (4G) mobile communication system, the wireless communication device generally adopts a single-antenna or dual-antenna radio frequency system architecture. Currently, in a new radio (NR) system of the fifth generation (5G) mobile communication system, a requirement on supporting a four-antenna radio frequency system architecture is proposed.

SUMMARY

Implementations of the disclosure provide a multi-way switch, a radio frequency system, and a wireless communication device.

According to a first aspect of implementations of the disclosure, a multi-way switch is provided. The multi-way switch includes six T ports and four P ports. The six T ports include two first T ports and each of the two first T ports is coupled with all of the four P ports. The two first T ports support only a transmission function.

The multi-way switch is configured to be coupled with a radio frequency circuit and an antenna system of a wireless communication device operable in a dual-frequency dual-transmit mode. The antenna system includes four antennas corresponding to the four P ports.

According to a second aspect of implementations of the disclosure, a radio frequency system is provided. The radio frequency system includes an antenna system, a radio frequency circuit, and a multi-way switch coupled with the radio frequency circuit and the antenna system.

The multi-way switch includes six T ports and four P ports, the six T ports include two first T ports supporting only a transmission function and four second T ports supporting only a reception function, and each of the two first T ports is coupled with all of the four P ports. The antenna system includes four antennas corresponding to the four P ports.

The multi-way switch is configured to implement a preset function of transmitting an SRS through four antennas in turn.

According to a third aspect of implementations of the disclosure, a wireless communication device is provided.

The wireless communication device includes an antenna system, a radio frequency transceiver, a radio frequency circuit coupled with the radio frequency transceiver, and a multi-way switch coupled with the radio frequency circuit and the antenna system.

The multi-way switch includes six T ports and four P ports, the six T ports include two first T ports, and each of the two first T ports is coupled with all of the four P ports. The two first T ports support only a transmission function. The antenna system includes four antennas corresponding to the four P ports.

The multi-way switch is configured to implement a preset function of transmitting an SRS through four antennas in turn.

BRIEF DESCRIPTION OF THE DRAWINGS

To describe technical solutions in implementations of the present disclosure or in the related art more clearly, the following briefly introduces the accompanying drawings required for describing the implementations or the related art. Apparently, the accompanying drawings in the following description only illustrate some implementations of the present disclosure. Those of ordinary skill in the art may also obtain other drawings based on these accompanying drawings without creative efforts.

DETAILED DESCRIPTION

Figure 1:
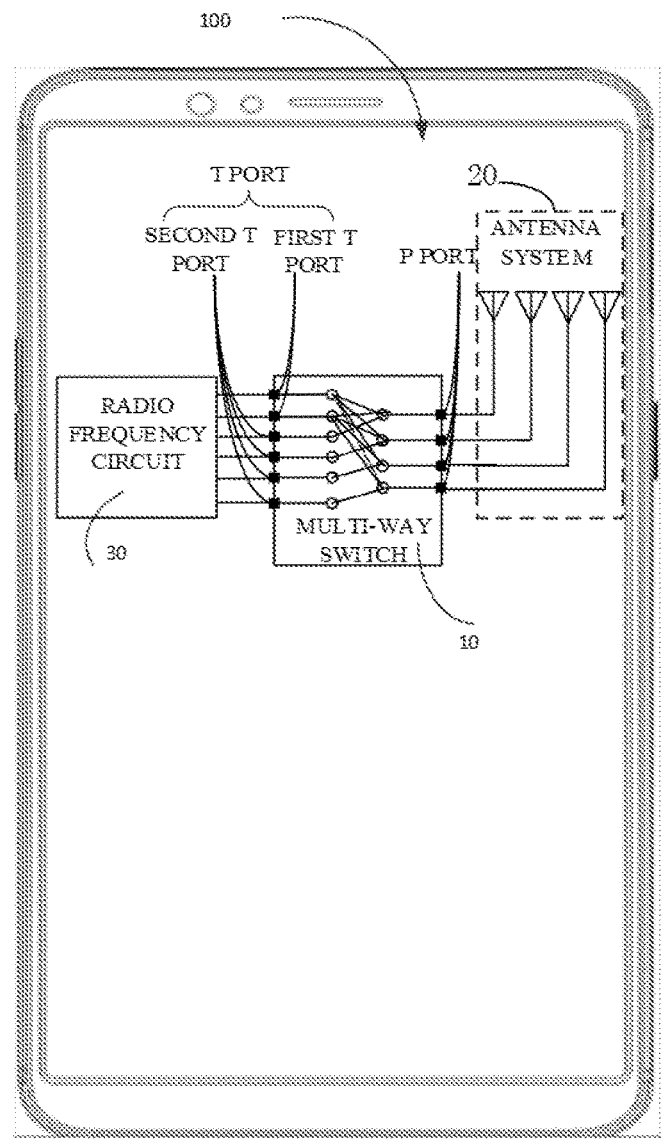
FIG. 1 is a schematic structural diagram illustrating a multi-way switch according to an implementation of the disclosure.

Technical solutions in implementations of the present disclosure will be described clearly and completely hereinafter with reference to the accompanying drawings described in the previous chapter. Apparently, the described implementations are merely some rather than all implementations of the present disclosure. All other implementations obtained by those of ordinary skill in the art based on the implementations of the present disclosure without creative efforts shall fall within the protection scope of the present disclosure.

The terms "first", "second", and the like used in the specification, the claims, and the accompany drawings of the present disclosure are to distinguish different objects rather than describe a particular order. The terms "include", "comprise", and "have" as well as variations thereof are intended to cover non-exclusive inclusion. For example, a process, method, system, product, or apparatus including a series of steps or units is not limited to the listed steps or units. Instead, it can optionally include other steps or units that are not listed; alternatively, other steps or units inherent to the process, method, product, or apparatus can also be included.

The term "embodiment" or "implementation" referred to herein means that a particular feature, structure, or characteristic described in conjunction with the implementation may be contained in at least one implementation of the present disclosure. The phrase appearing in various places in the specification does not necessarily refer to the same implementation, nor does it refer to an independent or alternative implementation that is, mutually exclusive with other implementations. It is explicitly and implicitly understood by those skilled in the art that an implementation described herein may be combined with other implementations.

The wireless communication device involved in the implementations of the present disclosure may include an electronic device, a base station, or a service. The electronic device may include various handheld devices, in-vehicle devices, wearable devices (such as smart watches, mobile powers, wireless headsets, smart bracelets, smart earrings, brainwave acquisition devices, smart hearing aids, smart rings, smart necklaces, smart bracelets, virtual reality (VR) devices, etc.), wireless charging receivers, computing devices or other processing devices connected to the wireless modem, as well as various forms of user equipments (UE), mobile stations (MS), terminal devices, and the like. For the convenience of description, the above-mentioned devices are collectively referred to as a wireless communication device.

At present, sounding reference signal (SRS) switching in four antennas of a mobile phone is a mandatory option for China mobile communications corporation (CMCC) in the China mobile fifth generation (5G) Scale Test Technical White Paper_Terminal, which is optional in the 3rd generation partnership project (3GPP). A main purpose of the SRS transmission is for a base station to determine quality and parameters of four channels via measuring uplink signals transmitted by the four antennas of the mobile phone in turn, to perform a beamforming of a downlink massive multi-input multi-output (MIMO) antenna array on the four channels according to a channel reciprocity, and finally to obtain the best data transmission performance for a downlink 4×4 MIMO.

In order to satisfy requirements of SRS switching in four antennas, implementations of the present disclosure provide a radio frequency architecture based on a simplified 4P6T antenna switch. Compared with a 3P3T/DPDT/multi-way small switch switching scheme, the present switching scheme can reduce the number of series switches in each path (all or part of switches are integrated into the 4P6T main switch), thereby reducing link loss and optimizing the overall transmission and reception performance of the terminal. The implementations of the present disclosure are described in detail below.

FIG. 1 is a schematic structural diagram illustrating a multi-way switch 10 according to an implementation of the disclosure. The multi-way switch 10 includes six T ports and four P ports. The six T ports include two first T ports supporting only a transmission function and each of the two first T ports is coupled with all of the four P ports (that is, fully coupled). The remaining four T ports are coupled with the four P ports in one-to-one correspondence, such that any two T ports of the remaining four T ports are coupled with different P ports. The multi-way switch 10 is applicable to a wireless communication device 100 operable in a dual-frequency dual-transmit mode. The wireless communication device 100 includes an antenna system 20 and a radio frequency circuit 30. The antenna system 20 includes four antennas. The four antennas correspond to the four P ports; specifically, the four antennas and the four P ports are in one-to-one correspondence.

The multi-way switch 10 is configured to be coupled with the radio frequency circuit 30 and the antenna system 20 to implement a preset function of the wireless communication device 100. The preset function is a function of transmitting an SRS through the four antennas in turn, which can be understood as a four-port SRS function.

Figure 2:
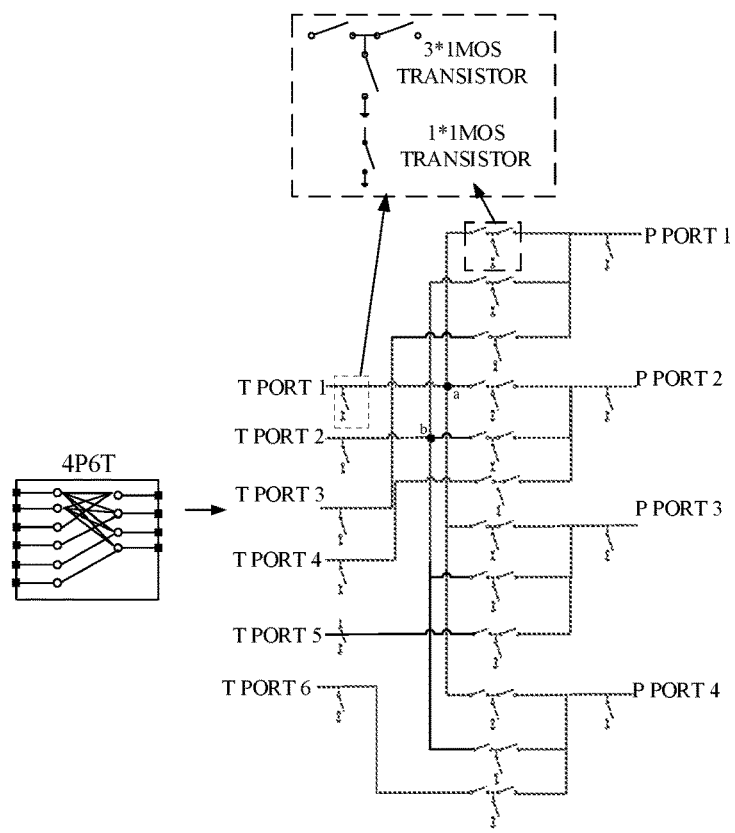
FIG. 2 is a schematic structural diagram illustrating a simplified 4P6T switch according to an implementation of the disclosure.

"P port" in implementations of the disclosure is the abbreviation of "pole port", which refers to ports coupled with antennas of the multi-way switch. "T port" in implementations of the disclosure is the abbreviation of "throw port", which refers to ports coupled with radio frequency modules of the multi-way switch. The multi-way switch is a 4P6T switch for example. "Module" herein can refer to circuits and any combination of related components. As illustrated in FIG. 2 for example, the four P ports are embodied as P port 1, P port 2, P port 3, and P port 4, and the six T ports are embodied as T port 1, T port 2, T port 3, T port 4, T port 5, and T port 6. Specifically, as illustrated in FIG. 2, T port 1 extends to the right via a first horizontal line and intersects with a third vertical line at a real point a, and then via real point a, T port 1 is respectively coupled with P port 1, P port 2, P port 3, and P port 4. Correspondingly, T port 2 extends to the right via a second horizontal line and intersects with a second vertical line at a real point b, and then via real point b, T port 2 is respectively coupled with P port 1, P port 2, P port 3, and P port 4.

The concept of "coupling", "full-coupling", or other kinds of coupling between the T ports and the P ports of the multi-way switch 10 described in the implementations of the disclosure refers to a state in which the T ports are coupled with the P ports through first switch transistors. One T port or one P port may be one port of a second switch transistor. The first switch transistors are configured to control a unidirectional conduction state between the T ports and the P ports (including a unidirectional conduction state from the T ports to the P ports and a unidirectional conduction state from the P ports to the T ports). The first switch transistor can be, for example, a switch array including three field-effect transistors (such as metal-oxide-semiconductor (MOS) transistors). When the first switch transistor is disconnected and not grounded, parasitic parameters will greatly affect performance of other connected ports. Therefore, the first switch transistor is implemented with three MOS transistors, where the three MOS transistors can be in a common source connection, that is, coupled at a common source. When the first switch transistor is disconnected, two MOS transistors at two ends are disconnected and one MOS transistor in the middle is grounded. The second switch transistor is configured to enable a corresponding port (T port or P port) and can be, for example, a MOS transistor. The specific configurations of the first switch transistor and the second switch transistor are not limited herein. In one implementation, the wireless communication device 100 can control paths between the T ports and the P ports to switch on through the first switch transistors. As one implementation, the wireless communication device 100 can be provided with a dedicated controller to be coupled with switch transistors of the multi-way switch 10.

The concept of "fully coupled" is defined for the T ports and means that one T port is coupled with all P ports. The expression of "the first T ports are fully coupled ports" means that each of the two first T ports is coupled with all of the four P ports.

The function of transmitting an SRS through the four antennas corresponding to the four P ports in turn refers to a process in which the wireless communication device interacts with a base station based on polling mechanism to determine quality of an uplink channel corresponding to each antenna.

The wireless communication device may be a mobile phone or other terminal devices supporting the 5G NR, such as customer premise equipment (CPE) or a mobile wireless-fidelity (MIFI).

The "dual-frequency dual-transmit mode" refers to an operating mode in which the wireless communication device can support dual frequency band-two uplink (UL) transmit paths or dual frequency band-four downlink (DL) receive paths.

The multi-way switch 10 includes field-effect transistors. Since two of the six T ports are coupled with all of the four P ports and each of the other T ports is configured to be coupled with one fixed antenna for receiving, the number of built-in field-effect transistors, volume, and cost of the 4P6T switch can be reduced, and performance of the 4P6T switch can be improved as well. For the convenience of description, the number of first T ports fully coupled with the four P ports is defined as m herein. Details will be described hereinafter.

For example, assume that the multi-way switch includes six T ports, m=2 (that is, the six T ports include two first T ports), and the multi-way switch includes field-effect transistors; among the six T ports, if each of the two first T ports is fully coupled with the four P ports, and each of four second T ports is coupled with one corresponding P port, as illustrated in FIG. 2 of a schematic structural diagram of the multi-way switch, the number of the MOS transistors of the multi-way switch is 6+(2*4+(6-2)*1)*3+4=46.

By limiting the number of T ports that are fully coupled with the four P ports (in other words, fully coupled T ports), the number of switches of the radio frequency system of the wireless communication device 100 can be effectively reduced. The number of fully coupled T ports has a great influence on performance of the radio frequency system.

In addition, the wireless communication device 100 further includes a radio frequency transceiver. The radio frequency transceiver is coupled with the radio frequency circuit 30.

As can be seen, according to implementations of the present disclosure, the wireless communication device 100 includes the antenna system 20, the radio frequency circuit 30, and the multi-way switch 10. The antenna system 20 includes the four antennas. The multi-way switch 10 includes the six T ports and the four P ports. The four antennas correspond to the four P ports. The multi-way switch 10 is configured to be coupled with the radio frequency circuit 30 and the antenna system 20 to implement the preset function of transmitting an SRS through the four antennas in turn of the wireless communication device 100.

Figure 3:
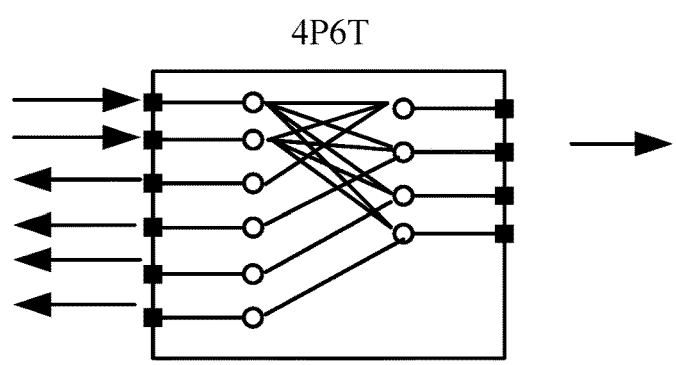
FIG. 3 is a schematic structural diagram illustrating a 4P6T switch according to an implementation of the disclosure.

In one possible implementation, in addition to the two first T ports, the six T ports further include four second T ports. Each of the four second T ports is individually coupled with a corresponding P port of the four P ports. That is, the four second T ports are coupled with the four P ports in one-to-one correspondence. T ports at the same frequency band among the four second T ports are coupled with different P ports. Each of the four P ports is configured to be coupled with a corresponding antenna of the four antennas, that is, one P port is coupled with one antenna and any two P ports are configured to be coupled with different antennas. As illustrated in FIG. 3, the two first T ports can support a transmission function (that is, a signal transmission function) and the four second T ports can support only a reception function (that is, a signal reception function).

For the convenience of description, in following figures, Nx represents one frequency band, and Ny represents another frequency band.

In one implementation, the expression of "among the four second T ports, any two second T ports at the same frequency band being coupled with different P ports" means that second T ports operable at the same frequency band in the four second T ports are coupled with different P ports. For example, if second T port 1 is operable at the first frequency band and second T port 2 is also operable at the first frequency band, second T port 1 may be coupled with P port 1, second T port 2 may be coupled with P port 2, and P port 1 is different from P port 2.

In one possible implementation, the multi-way switch 10 includes field-effect transistors, and forty-six field-effect transistors are configured in the multi-way switch 10.

Figure 4A:
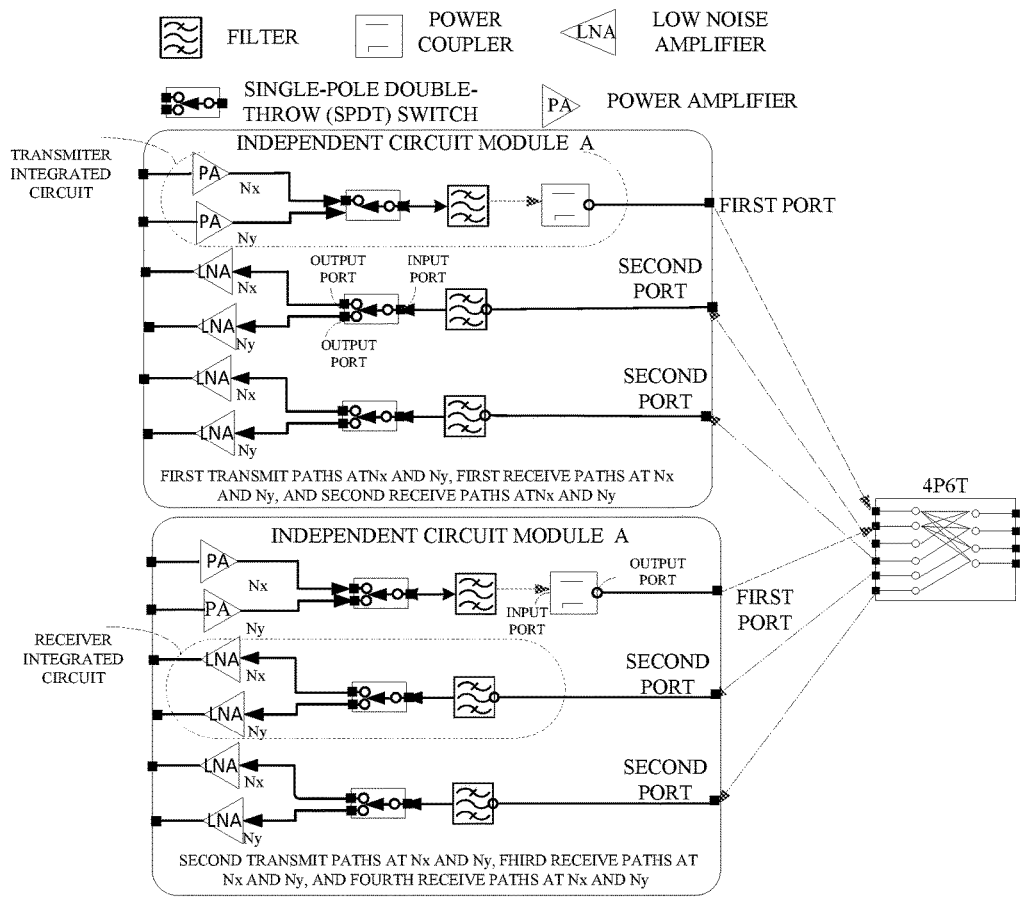
FIG. 4A is a schematic structural diagram illustrating two independent circuit modules corresponding to a 4P6T switch according to an implementation of the disclosure.

In one possible implementation, as illustrated in FIG. 4A, the radio frequency circuit 30 physically includes two independent circuit modules A. The radio frequency circuit 30 of the wireless communication device 100 logically includes two transmitter integrated circuits and four receiver integrated circuits. The radio frequency circuit 30 physically includes two independent circuit modules A. The two independent circuit modules A include transmit ports and each transmit port is configured to be coupled with a corresponding first T port, that is, the transmit ports are configured to be coupled with the two first T ports in one-to-one correspondence. The two independent circuit modules A include receive ports and each receive port is configured to be coupled with a corresponding second T port, that is, the receive ports are configured to be coupled with four second T ports in one-to-one correspondence. The "transmit port" refers to a port (may be composed of one or more components) which implements a corresponding transmission function and is located on the path after integration of transmitter circuits. The "receive port" refers to a port (may be composed of one or more components) which implements a corresponding reception function and is located on the path after integration of receiver circuits. It should be noted that the ports such as transmit ports and receive ports illustrated in the figures are exemplary and do not intend to indicate an exact port position and impose any restrictions.

In one implementation, each independent circuit module A includes one transmitter integrated circuit and two receiver integrated circuits. The transmitter integrated circuit includes two transmitter circuits, which work at different frequency bands and are integrated to be coupled with one first port of a corresponding independent circuit module A, where the corresponding independent circuit module A refers to an independent circuit module to which the two transmitter circuits belong. Each receiver integrated circuit includes two receiver circuits, which are integrated to be coupled with one second port of an independent circuit module A to which the two receiver circuits belong.

The first ports are configured to be coupled with the two first T ports in one-to-one correspondence and the second ports are configured to be coupled with the four second T ports in one-to-one correspondence. In other words, each first port is configured to be coupled with one corresponding first T port and each second port is configured to be coupled with one corresponding second T port.

In this implementation, since two power amplifiers (PAs) at the same frequency band can work simultaneously (corresponding to UL MIMO mode), a transmit power will be high, and two signals will interfere with each other. In addition, the two PAs will affect heat dissipation efficiency when working at the same time. On the basis of this consideration, the PAs in the transmitter circuits need to be disposed in two independent circuit modules. On the other hand, the PAs in the transmitter circuits at different frequency bands may not work simultaneously. Therefore, two PAs at different frequency bands can be disposed in the same independent circuit module, which is beneficial to reducing interference and improving signal processing efficiency and heat dissipation efficiency of the radio frequency system.

Figure 4B:
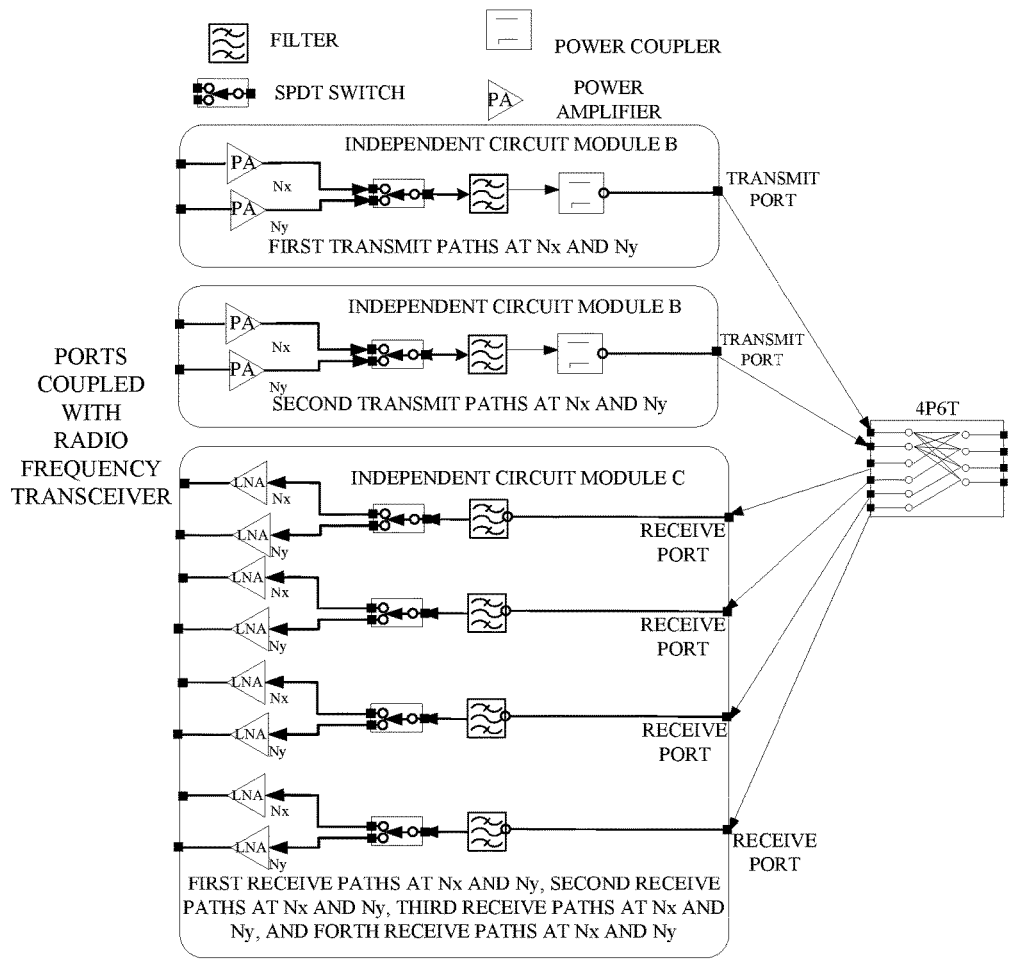
FIG. 4B is a schematic structural diagram illustrating three independent circuit modules corresponding to a 4P6T switch according to an implementation of the disclosure.

In another possible implementation, as illustrated in FIG. 4B, the radio frequency circuit 30 of the wireless communication device 100 logically includes two transmitter integrated circuits and four receiver integrated circuits. The radio frequency circuit 30 physically includes three independent circuit modules. The three independent circuit modules include two first independent circuit modules and one second independent circuit module. In this implementation, the first independent circuit module is embodied as an independent circuit module B and the second independent circuit module is embodied as an independent circuit module C. Each independent circuit module B includes one transmitter integrated circuit. The transmitter integrated circuit includes two transmitter circuits, which work at different frequency bands and are integrated to be coupled with one first port of an independent circuit module B to which the two transmitter circuits belong. The independent circuit module C includes four receiver integrated circuits. Each receiver integrated circuit includes two receiver circuits, which are integrated to be coupled with one second port of the independent circuit module C.

Figure 4C:
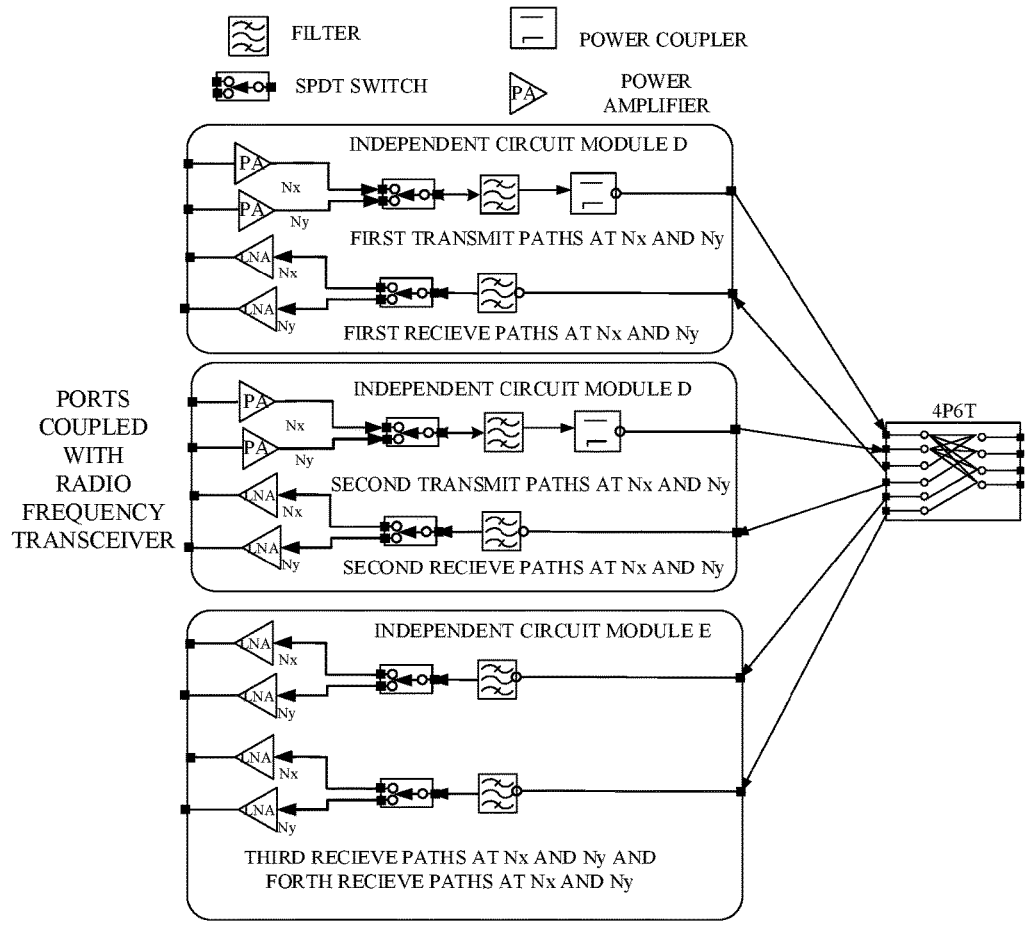
FIG. 4C is a schematic structural diagram illustrating another three independent circuit modules corresponding to a 4P6T switch according to an implementation of the disclosure.

In one possible implementation, as illustrated in FIG. 4C, the radio frequency circuit 30 of the wireless communication device 100 logically includes two transmitter integrated circuits and four receiver integrated circuits. The radio frequency circuit 30 physically includes three independent circuit modules. The three independent circuit modules include two first independent circuit modules and one second independent circuit module. In this implementation, the first independent circuit module is embodied as an independent circuit module D and the second independent circuit module is embodied as an independent circuit module E. Each independent circuit module D includes one transmitter integrated circuit and one receiver integrated circuit. The transmitter integrated circuit includes two transmitter circuits, which work at different frequency bands and are integrated to be coupled with one first port of an independent circuit module D to which the two transmitter circuits belong. The receiver integrated circuit includes two receiver circuits, which are integrated to be coupled with one second port of an independent circuit module D to which the two receiver circuits belong. The independent circuit module E includes two receiver integrated circuits. Each receiver integrated circuit includes two receiver circuits, which are integrated to be coupled with one second port of the independent circuit module E.

Figure 4D:
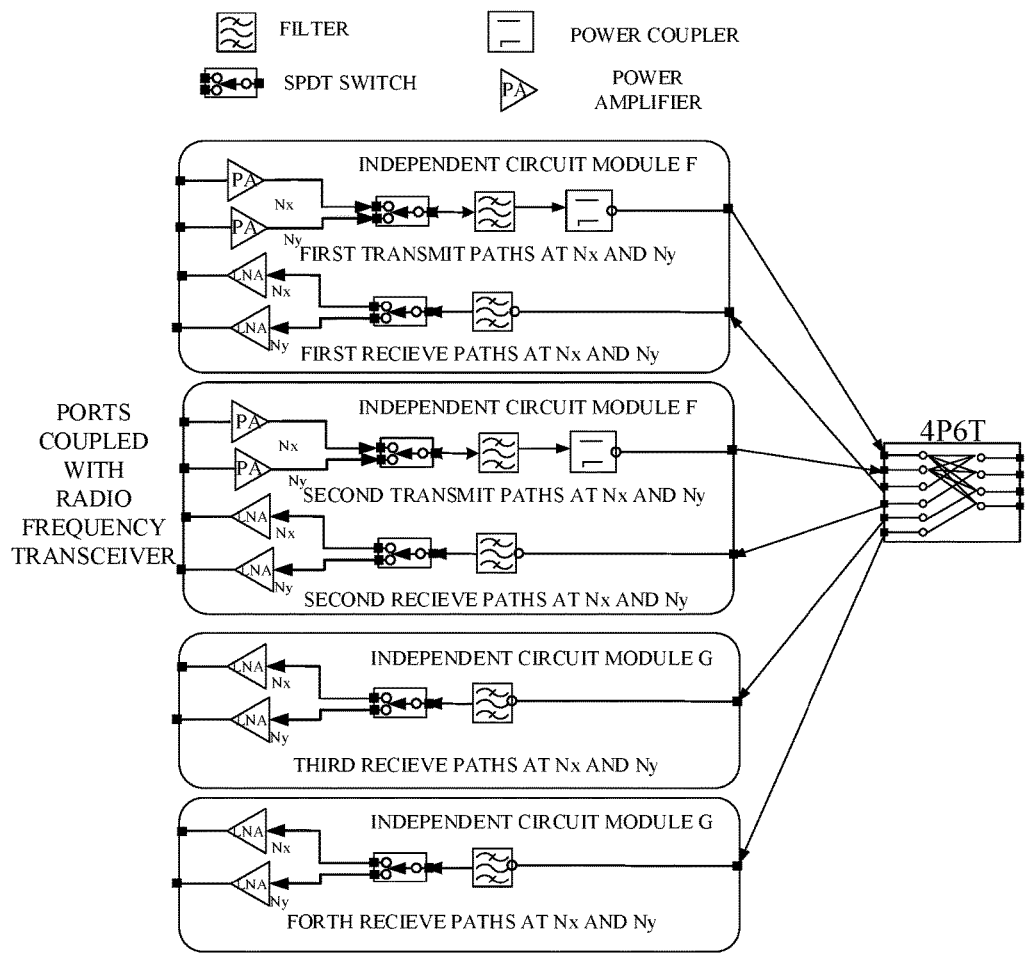
FIG. 4D is a schematic structural diagram illustrating four independent circuit modules corresponding to a 4P6T switch according to an implementation of the disclosure.

In one possible implementation, as illustrated in FIG. 4D, the radio frequency circuit 30 of the wireless communication device 100 logically includes two transmitter integrated circuits and four receiver integrated circuits. The radio frequency circuit 30 physically includes four independent circuit modules. The four independent circuit modules include two first independent circuit modules and two second independent circuit modules. In this implementation, the first independent circuit module is embodied as an independent circuit module F and the second independent circuit module is embodied as an independent circuit module G. Each independent circuit module F includes one transmitter integrated circuit and one receiver integrated circuit. The transmitter integrated circuit includes two transmitter circuits, which work at different frequency bands and are integrated to be coupled with one first port of an independent circuit module F to which the two transmitter circuits belong. The receiver integrated circuit includes two receiver circuits, which are integrated to be coupled with one second port of an independent circuit module F to which the two receiver circuits belong. Each independent circuit module G includes one receiver integrated circuit. The receiver integrated circuit includes two receiver circuits, which are integrated to be coupled with one second port of an independent circuit module G to which the two receiver circuits belong.

Figure 4E:
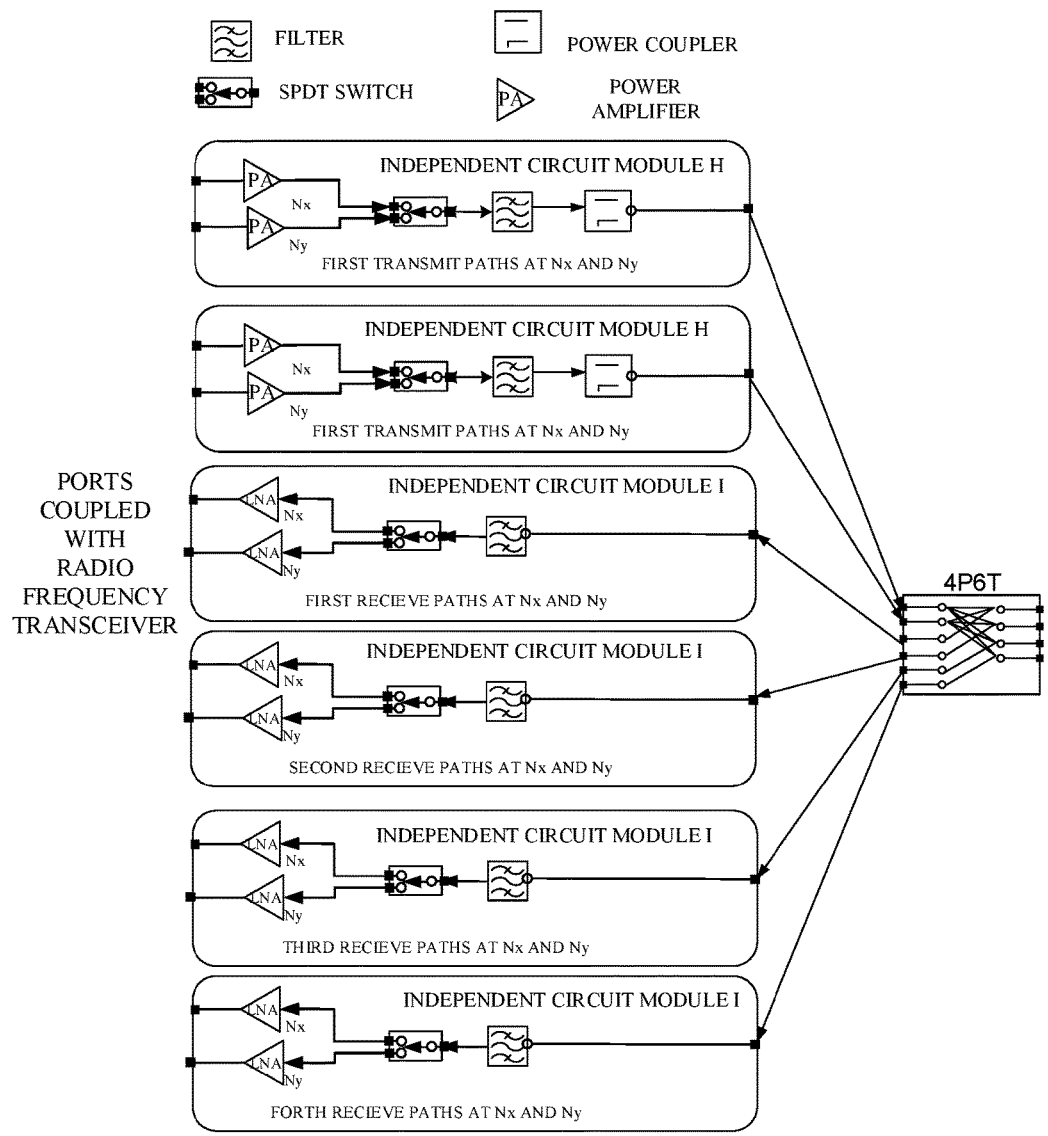
FIG. 4E is a schematic structural diagram illustrating six independent circuit modules corresponding to a 4P6T switch according to an implementation of the disclosure.

In one possible implementation, as illustrated in FIG. 4E, the radio frequency circuit 30 of the wireless communication device 100 logically includes two transmitter integrated circuits and four receiver integrated circuits. The radio frequency circuit 30 physically includes six independent circuit modules, and the six independent circuit modules include two first independent circuit modules and four second independent circuit modules. In this implementation, the first independent circuit module is embodied as an independent circuit module H and the second independent circuit module is embodied as an independent circuit module I. Each independent circuit module H includes one transmitter integrated circuit. The transmitter integrated circuit includes two transmitter circuits, which work at different frequency bands and are integrated to be coupled with one first port of an independent circuit module H to which the two transmitter circuits belong. Each independent circuit module I includes one receiver integrated circuit. The receiver integrated circuit includes two receiver circuits, which are integrated to be coupled with one second port of an independent circuit module I to which the two receiver circuits belong.

The specific configurations of the transmitter circuit and the receiver circuit, and definitions related to the multi-way switch 10 are similar to the foregoing implementations and will not be described herein again. In addition, it can be understood that, the exemplary matching manner of the radio frequency circuit 30 and the multi-way switch 10 includes but is not limited to the structure of the drawings.

It can be seen that, when the multi-way switch 10 is configured as a 4P6T switch and m=2 (that is, the multi-way switch 10 includes two first T ports), the multi-way switch 10 of the implementation of the disclosure can enable the wireless communication device 100 to be operable in the dual-frequency dual-transmit mode. It is beneficial to simplifying the radio frequency architecture of the terminal supporting four-port SRS switching in the 5G NR, reducing the number of switches in transmit paths and receive paths, and reducing path loss, thereby improving transmit power/sensitivity, data transmission rate in the 5G NR, and uplink and downlink coverage of the mobile phone, and reducing power consumption.

It can be understood that, the above-mentioned receiver circuits and transmitter circuits can be implemented in various manners. The implementations of the disclosure are not particularly restricted.

In one possible implementation, each receiver circuit includes one low noise amplifier (LNA) and one filter. The filter has an input port coupled with one second port of an independent circuit module and has an output port coupled with an input port of the LNA. The LNA has an output port configured to be coupled with a corresponding port of a radio frequency transceiver.

Each transmitter circuit includes one power amplifier (PA), one filter, and one coupler. The PA has an input port configured to be coupled with a corresponding port of the radio frequency transceiver and has an output port coupled with an input port of the filter. The filter has an output port coupled with an input port of the coupler. The coupler has an output port coupled with one first port of an independent circuit module.

Each receiver integrated circuit is realized through the two receiver circuits that are integrated via a single-pole double-throw (SPDT) switch. The SPDT switch has two output ports each coupled with an input port of a LNA of one of the two receiver circuits and has an input port coupled with an output port of a filter, and the filter has an input port coupled with a second port of the independent circuit module.

Each transmitter integrated circuit is realized through the two transmitter circuits that are integrated via a switch, the two transmitter circuits work at different frequency bands and share the input port of the coupler, and the output port of the coupler is coupled with the first port of the independent circuit module.

In the foregoing implementations, Nx represents a first frequency band supported by a wireless communication device in the 5G NR, Ny represents a second frequency band supported by a wireless communication device in the 5G NR, and the first frequency band is not overlapped with the second frequency band.

Figure 5:
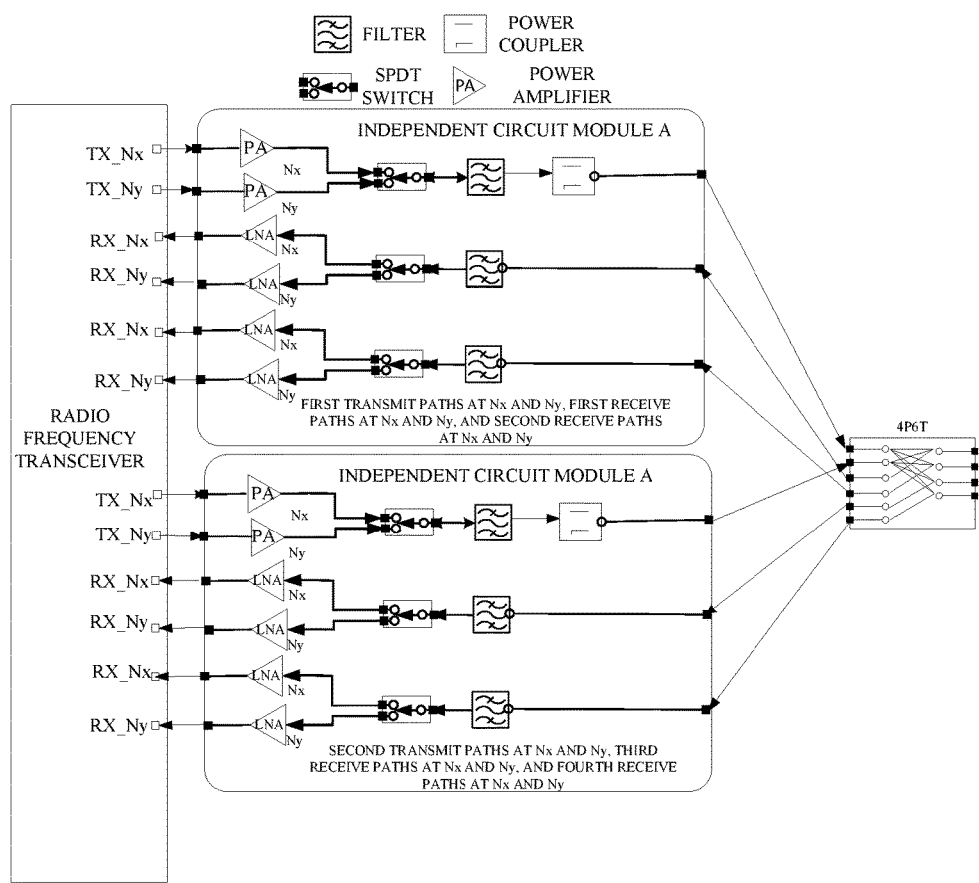
FIG. 5 is a schematic structural diagram illustrating a radio frequency system according to an implementation of the disclosure.

As illustrated in FIG. 5, a radio frequency system is provided. The radio frequency system includes two independent circuit modules illustrated in FIG. 4A, a radio frequency transceiver, and the multi-way switch described in the above implementations. It is to be noted that, the radio frequency transceiver is optional.

Referring to FIG. 5, TX represents ports supporting a signal transmission function, and RX represents ports supporting a signal reception function.

It can be understood that, the matching manner of the above radio frequency circuit and the multi-way switch includes but is not limited to the structure of the drawing, and is merely an example herein.

In one possible implementation, the four antennas include a first antenna, a second antenna, a third antenna, and a fourth antenna. These four antennas are all operable at a 5G NR frequency band.

The 5G NR frequency band may include, for example, 3.3 GHz to 3.8 GHz and 4.4 GHz to 5 GHz.

In one possible implementation, the four antennas include a first antenna, a second antenna, a third antenna, and a fourth antenna. The first antenna and the fourth antenna are antennas operable at a long term evolution (LTE) frequency band and a 5G NR frequency band. The second antenna and the third antenna are antennas only operable at the 5G NR frequency band.

The first antenna and fourth antenna are intended to support DL 4×4 MIMO for some frequency bands in LTE on terminals. These two antennas are shared with the 5G NR (hereinafter, "shared antennas" for short). The LTE frequency band may include, for example, 1880 MHz to 1920 MHz and 2496 MHz to 2690 MHz.

Figure 6:
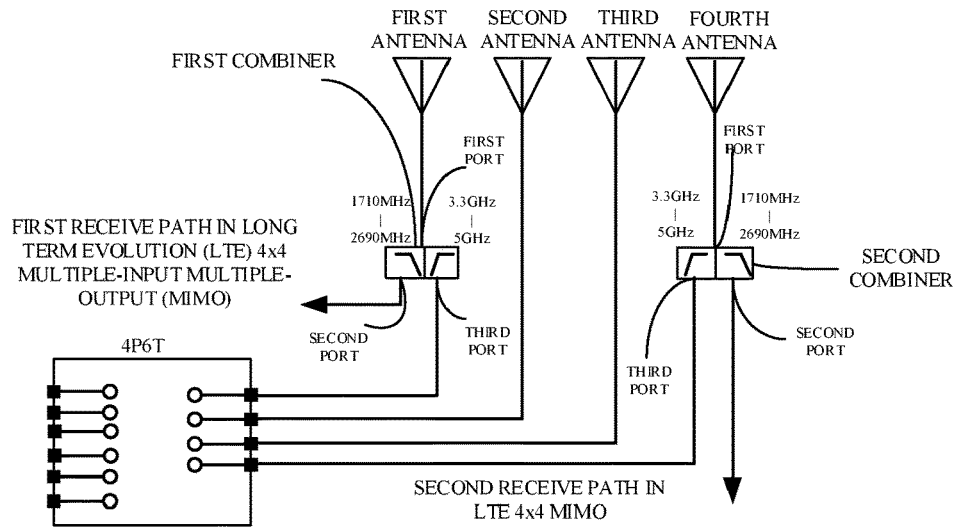
FIG. 6 is a schematic structural diagram illustrating an antenna system of a wireless communication device according to an implementation of the disclosure.

In one possible implementation, as illustrated in FIG. 6, the antenna system further includes a first combiner and a second combiner. The first combiner has a first port coupled with the first antenna, a second port coupled with a first receive path in LTE 4×4 MIMO configuration of the radio frequency system, and a third port coupled with a corresponding P port of the multi-way switch. The second combiner has a first port coupled with the fourth antenna, a second port coupled with a second receive path in the LTE 4×4 MIMO configuration of the radio frequency system, and a third port coupled with a corresponding P port of the multi-way switch.

The LTE 4*4 MIMO is a downlink LTE receive circuit and can be defined as a third receive path. Since the LTE currently has two receive paths, in order to support LTE 4×4 MIMO, the third receive path and a fourth receive path are added.

When m ports are only used for transmission, according to performance of four NR antennas, the wireless communication device will arrange one antenna with better performance for the circuit for PRX (primary receiver), and the antenna will be in a standby state. Moreover, m ports of the switch having both the transmission function and the reception function can be configured for TX (transmit) and PRX purpose, and thus the antenna can be switched arbitrarily. In this way, there is no need to restrict the coupling between ports of shared antennas.

Figure 7:
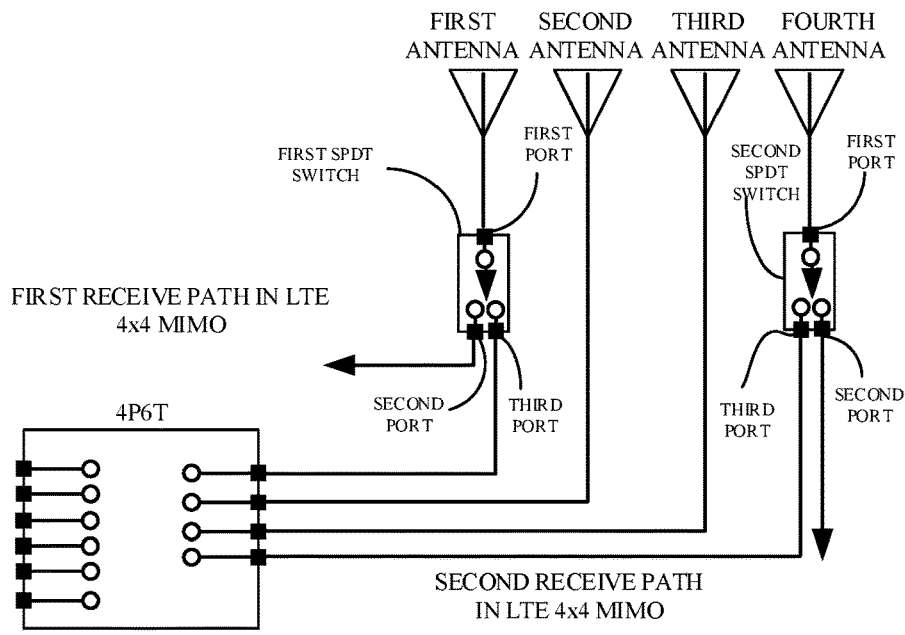
FIG. 7 is a schematic structural diagram illustrating another antenna system of a wireless communication device according to an implementation of the disclosure.

In one possible implementation, as illustrated in FIG. 7, the antenna system further includes a first SPDT switch and a second SPDT switch. The first SPDT switch has a first port coupled with the first antenna, a second port with a first receive path in LTE 4×4 MIMO configuration of the radio frequency system, and a third port coupled with a corresponding P port of the multi-way switch. The second SPDT switch has a first port coupled with the fourth antenna, a second port coupled with a second receive path in the LTE 4×4 MIMO configuration of the radio frequency system, and a third port coupled with a corresponding P port of the multi-way switch.

The schemes of the disclosure can be combined or replaced with each other. For example, the antenna system and/or the multi-way switch described above can be applied or combined into the radio frequency system and the wireless communication device below. It is to be noted that, "the antenna system and/or the multi-way switch" of the disclosure means "the antenna system or the multi-way switch" or "the antenna system and the multi-way switch".

It should be noted that, some or all of the accompanying details of technical features of the multi-way switches provided by the above-identified implementations, can be used to or incorporate into a radio frequency system. The radio frequency system may further include an antenna system and a radio frequency circuit, and the multi-way switch may be coupled with the radio frequency circuit and the antenna system.

Figure 8:
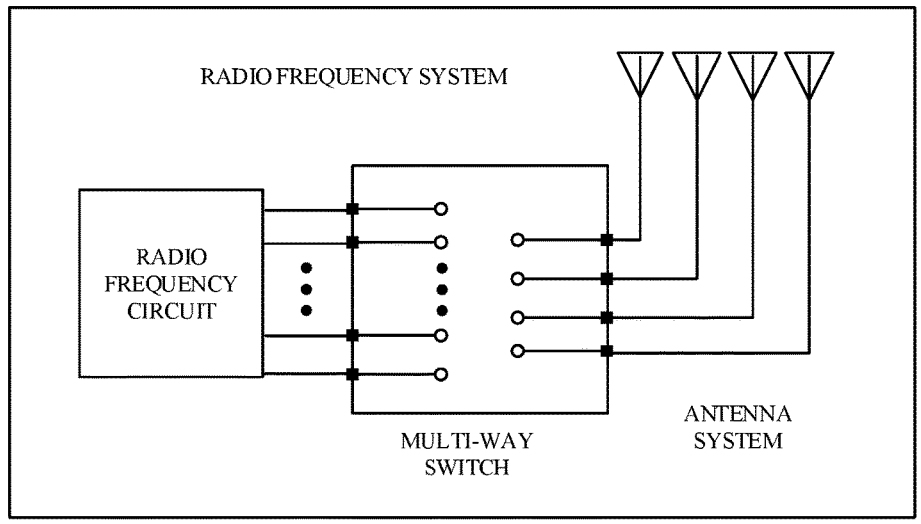
FIG. 8 is a schematic structural diagram illustrating a radio frequency system according to another implementation of the disclosure.

In one possible implementation, FIG. 8 is a schematic structural diagram illustrating a radio frequency system according to another implementation of the disclosure. The radio frequency system includes an antenna system, a radio frequency circuit, and a multi-way switch coupled with the radio frequency circuit and the antenna system. The multi-way switch includes six T ports and four P ports, the six T ports include two first T ports supporting only a transmission function and four second T ports supporting only a reception function, and each of the two first T ports is coupled with all of the four P ports. The multi-way switch includes forty-six field-effect transistors. The antenna system includes four antennas corresponding to the four P ports. The multi-way switch is configured to implement a preset function of transmitting an SRS through the four antennas in turn.

In one implementation, each of the four second T ports is coupled with one of the four P ports, and T ports at the same frequency band among the four second T ports are coupled with different P ports. Each of the four P ports is coupled with a corresponding antenna of the four antennas. Specifically, as illustrated in FIGS. 1-2, the four second T ports are coupled with the four P ports in one-to-one correspondence. The four P ports are coupled with the four antennas in one-to-one correspondence.

In one implementation, the four antennas include a first antenna, a second antenna, a third antenna, and a fourth antenna. The first antenna, the second antenna, the third antenna, and the fourth antenna are antennas operable at a 5G NR frequency band.

As one implementation, the four antennas include a first antenna, a second antenna, a third antenna, and a fourth antenna. The first antenna and the fourth antenna are antennas operable at an LTE frequency band and a 5G NR frequency band. The second antenna and the third antenna are antennas only operable at the 5G NR frequency band.

The first antenna and fourth antenna are intended to support DL 4×4 MIMO for some frequency bands in LTE on terminals. These two antennas are shared with the 5G NR.

In one possible implementation, the antenna system further includes a first combiner and a second combiner. The first combiner has a first port coupled with the first antenna, a second port coupled with a first receive path in LTE 4×4 multiple-input multiple-output (MIMO) configuration of the radio frequency system, and a third port coupled with a corresponding P port of the multi-way switch. The second combiner has a first port coupled with the fourth antenna, a second port coupled with a second receive path in the LTE 4×4 MIMO configuration of the radio frequency system, and a third port coupled with a corresponding P port of the multi-way switch.

The LTE 4*4 MIMO is a downlink LTE receive circuit and can be defined as a third receive path. Since the LTE currently has two receive paths, in order to support LTE 4×4 MIMO, the third receive path and a fourth receive path are added.

When m ports are used for transmission, according to performance of NR four antennas, the wireless communication device will arrange one antenna with better performance for the circuit for PRX (primary receiver), and the antenna will be in a standby state. Moreover, m ports of the switch having both the transmission function and the reception function can be configured for TX (transmit) and PRX purpose, and thus the antenna can be switched arbitrarily. In this way, there is no need to restrict the coupling between ports of shared antennas.

In one possible implementation, the antenna system further includes a first SPDT switch and a second SPDT switch. The first SPDT switch has a first port coupled with the first antenna, a second port coupled with a first receive path in LTE 4×4 MIMO configuration of the radio frequency system, and a third port coupled with a corresponding P port of the multi-way switch. The second SPDT switch has a first port coupled with the fourth antenna, a second port coupled with a second receive path in the LTE 4×4 MIMO configuration of the radio frequency system, and a third port coupled with a corresponding P port of the multi-way switch.

Figure 9:
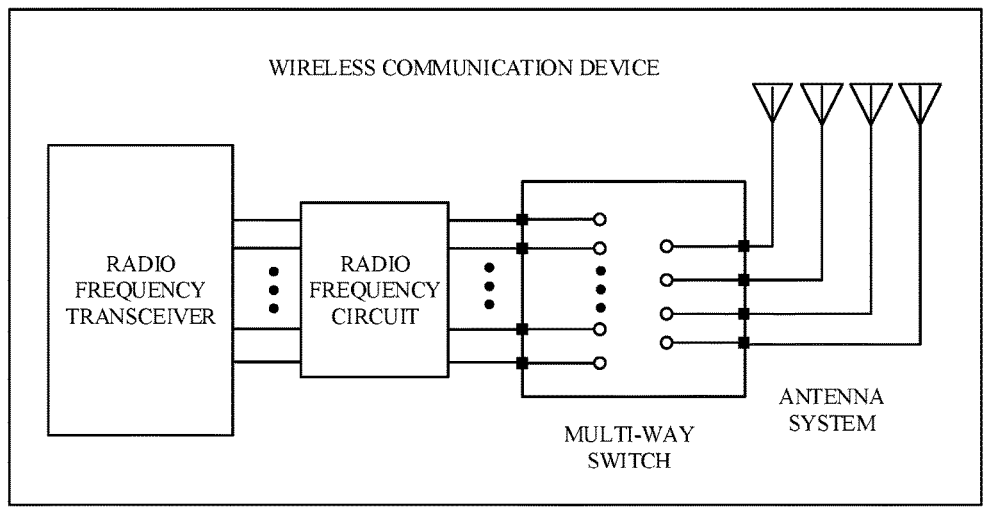
FIG. 9 is a schematic structural diagram illustrating a wireless communication device according to an implementation of the disclosure.

In one possible implementation, FIG. 9 is a schematic structural diagram illustrating a wireless communication device according to an implementation of the disclosure. The wireless communication device for example can be a terminal device, a base station, and the like and includes an antenna system, a radio frequency transceiver, a radio frequency circuit coupled with the radio frequency transceiver, and a multi-way switch coupled with the radio frequency circuit and the antenna system.

The multi-way switch includes six T ports and four P ports, the six T ports include two first T ports, and each of the two first T ports is coupled with all of the four P ports. The two first T ports support only a transmission function. The antenna system includes four antennas corresponding to the four P ports.

The multi-way switch is configured to implement a preset function of transmitting an SRS through the four antennas in turn.

The six T ports further include four second T ports. Each of the four second T ports is coupled with one of the four P ports, and T ports at the same frequency band among the four second T ports are coupled with different P ports. Each of the four P ports is configured to be coupled with a corresponding antenna of the four antennas. The four second T ports support only a reception function.

The four antennas include a first antenna, a second antenna, a third antenna, and a fourth antenna. The first antenna and the fourth antenna are antennas operable at an LTE frequency band and a 5G NR frequency band. The second antenna and the third antenna are antennas only operable at the 5G NR frequency band.

Figure 10:
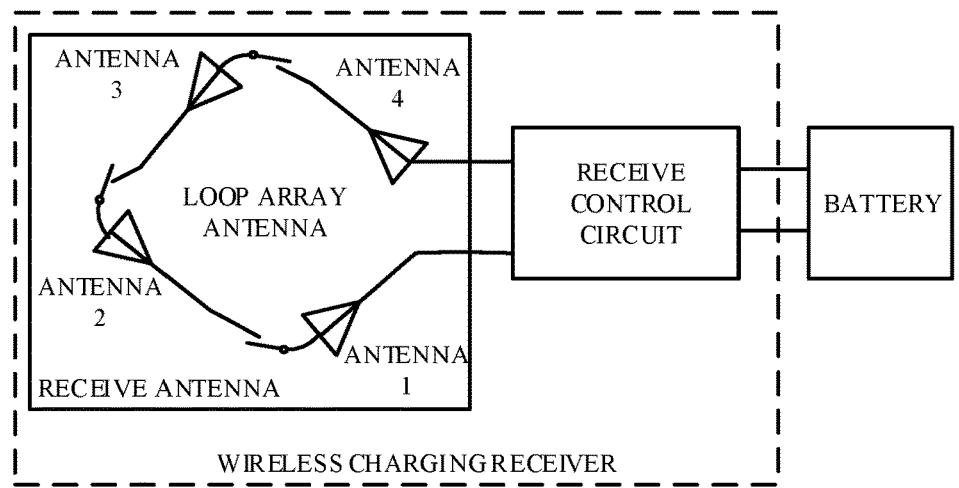
FIG. 10 is a schematic diagram illustrating a wireless charging receiver for multiplexing an antenna of a wireless communication device according to an implementation of the disclosure.

In addition, as illustrated in FIG. 10, the four antennas in the antenna system described in the implementations of the disclosure can also be multiplexed by a wireless communication device such as a wireless charging receiver. The wireless charging receiver includes a receive antenna and a receive control circuit. The receive antenna matches transmit antennas of a wireless charging transmitter (resonates at the same or similar frequency and transfers energy in a wireless manner in the way of radiative resonant magnetic coupling). The receive control circuit converts, through a loop array antenna, the energy into a direct current (DC) to output to charge a battery. The receive control circuit can dynamically adjust a frequency of the loop array antenna and match the frequency of the loop array antenna with frequencies of the transmit antennas of the wireless charging transmitter to achieve paired charging. Alternatively, the receive control circuit interacts with the wireless charging transmitter in real time on a frequency change range to implement an "exclusive encryption" wireless charging mode.

The receive antenna may be an antenna including at least one of the four antennas (in the case of multiple antennas, the multiple antennas are strobed via switches).

Figure 11:
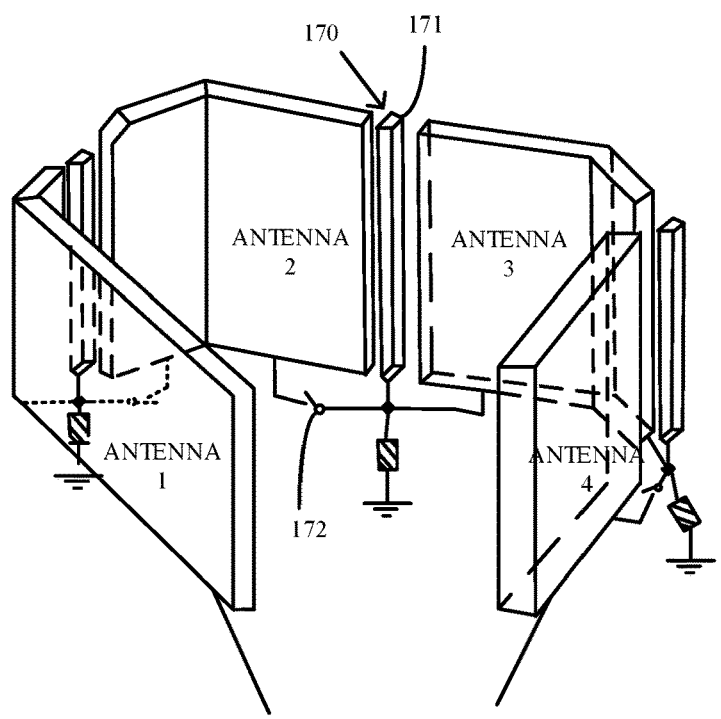
FIG. 11 is a schematic structural diagram illustrating a loop array antenna including four antennas according to an implementation of the disclosure.

For example, as illustrated in FIG. 11, the receive antenna is a loop array antenna including the four antennas described above. The four antennas include antenna 1, antenna 2, antenna 3, and antenna 4. Antenna 1 and antenna 4 are operable at both a LTE frequency band and a 5G NR frequency band, while antenna 2 and antenna 3 are only operable at the 5G NR frequency band. A port of antenna 1 and a port of antenna 4 are used as ports of the loop array antenna. Adjacent antennas are coupled via a gate circuit 170 with an isolation function. The gate circuit 170 includes a spacer 171 and a switch 172, where the spacer 171 is a conductor and the switch 172 is further coupled with a controller. The wireless communication device can conduct the switch 172 of each gate circuit 170 in a wireless charging mode to form a loop array antenna to receive energy. By adding the spacers 171 among the antennas, the gate circuit 170 can reduce mutual coupling among the multiple antennas of the wireless communication device in a normal communication mode, improve isolation among the multiple antennas, and optimize performance of the antennas. On the other hand, the multiple antennas can be coupled in series to form the loop array antenna through the switches 172, so as to better match the transmit antennas to transfer energy. Furthermore, since the capabilities of antenna 1 and antenna 4 are stronger than those of antenna 2 and antenna 3, the loop array antenna thus arranged can reduce energy loss in transmission as much as possible. Specifically, as illustrated in FIG. 11, antenna 1 and antenna 4 are not disposed adjacently. Compared with disposing antenna 1 and antenna 4 adjacently, not disposing antenna 1 and antenna 4 adjacently has the following advantages. When antenna 1 and antenna 4 are disposed adjacently, since both antenna 1 and antenna 4 are operable at the LTE frequency band and the 5G frequency band, overlap in frequency between antenna 1 and antenna 4 will be great, which will increase mutual coupling between antenna 1 and antenna 4 and in turn increase difficulty in matching impedance of antenna 1 with impedance of antenna 4, thereby resulting in increase in energy loss in transmission. In addition, influence of disposing antenna 1 and antenna 4 adjacently is substantially greater than that of disposing antenna 2 and antenna 3 adjacently, and advantages of not disposing antenna 1 and antenna 4 adjacently are substantially greater than those of not disposing antenna 2 and antenna 3 adjacently. Therefore, configuration illustrated in FIG. 11 will certainly cause stronger capabilities (energy-transmission efficiency) of antenna 1 and antenna 4 than those of antenna 2 and antenna 3, thereby improving transmission performance.

While the disclosure has been described in connection with certain implementations, it is to be pointed out that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A multi-way switch, comprising:
    six throw (T) ports and four pole (P) ports, the six T ports comprising two first T ports, and each of the two first T ports being coupled with all of the four P ports; the two first T ports supporting only a transmission function; and
    the multi-way switch being configured to be coupled with a radio frequency circuit and an antenna system of a wireless communication device operable in a dual-frequency dual-transmit mode, and the antenna system comprising four antennas corresponding to the four P ports.

2. The multi-way switch of claim 1, wherein
    the six T ports further comprise four second T ports;
    each of the four second T ports is individually coupled with a corresponding P port of the four P ports, and T ports at the same frequency band among the four second T ports are coupled with different P ports;
    each of the four P ports is configured to be coupled with a corresponding antenna of the four antennas; and
    the four second T ports support only a reception function.

3. The multi-way switch of claim 2, wherein
    the radio frequency circuit of the wireless communication device logically comprises two transmitter integrated circuits and four receiver integrated circuits;
    the radio frequency circuit physically comprises two independent circuit modules;
    each independent circuit module comprises one transmitter integrated circuit and two receiver integrated circuits; and
    the transmitter integrated circuit comprises two transmitter circuits working at different frequency bands and are integrated to be coupled with one first port of an independent circuit module to which the two transmitter circuits belong and each receiver integrated circuit comprises two receiver circuits integrated to be coupled with one second port of an independent circuit module to which the two receiver circuits belong.

4. The multi-way switch of claim 3, wherein
    each receiver integrated circuit is realized through two receiver circuits that are integrated via a single-pole double-throw (SPDT) switch, the SPDT switch has two output ports each coupled with an input port of a low noise amplifier (LNA) of one of the two receiver circuits and has an input port coupled with an output port of a filter, and the filter has an input port coupled with a second port of an independent circuit module; and
    each transmitter integrated circuit is realized through two transmitter circuits that are integrated via a SPDT switch, the two transmitter circuits work at different frequency bands and share an input port of a coupler, and the coupler has an output port coupled with one first port of an independent circuit module.

5. The multi-way switch of claim 3, wherein
    each first port is configured to be coupled with one corresponding first T port; and
    each second port is configured to be coupled with one corresponding second T port.

6. The multi-way switch of claim 2, wherein
    the radio frequency circuit of the wireless communication device logically comprises two transmitter integrated circuits and four receiver integrated circuits;

the radio frequency circuit physically comprises three independent circuit modules;

the three independent circuit modules comprise two first independent circuit modules and one second independent circuit module;

each first independent circuit module comprises one transmitter integrated circuit, the transmitter integrated circuit comprises two transmitter circuits working at different frequency bands and are integrated to be coupled with one first port of a first independent circuit module to which the two transmitter circuits belong; and the second independent circuit module comprises the four receiver integrated circuits;

each receiver integrated circuit comprises two receiver circuits integrated to be coupled with one second port of the second independent circuit module.

7. The multi-way switch of claim 2, wherein the radio frequency circuit of the wireless communication device logically comprises two transmitter integrated circuits and four receiver integrated circuits;

the radio frequency circuit physically comprises three independent circuit modules;

the three independent circuit modules comprise two first independent circuit modules and one second independent circuit module; and each first independent circuit module comprises one transmitter integrated circuit and one receiver integrated circuit, the transmitter integrated circuit comprises two transmitter circuits working at different frequency bands and are integrated to be coupled with one first port of a first independent circuit module to which the two transmitter circuits belong, and the receiver integrated circuit comprises two receiver circuits integrated to be coupled with one second port of a first independent circuit module to which the two receiver circuits belong, and the second independent circuit module comprises two receiver integrated circuits, and each receiver integrated circuit comprises two receiver circuits integrated to be coupled with one second port of the second independent circuit module.

8. The multi-way switch of claim 2, wherein the radio frequency circuit of the wireless communication device logically comprises two transmitter integrated circuits and four receiver integrated circuits;

the radio frequency circuit physically comprises four independent circuit modules; the four independent circuit modules comprise two first independent circuit modules and two second independent circuit modules; and each first independent circuit module comprises one transmitter integrated circuit and one receiver integrated circuit, the transmitter integrated circuit comprises two transmitter circuits working at different frequency bands and are integrated to be coupled with one first port of a first independent circuit module to which the two transmitter circuits belong, and the receiver integrated circuit comprises two receiver circuits integrated to be coupled with one second port of a first independent circuit module to which the two receiver circuits belong, and each second independent circuit module comprises one receiver integrated circuit, and the receiver integrated circuit comprises two receiver circuits integrated to be coupled with one second port of a second independent circuit module to which the two receiver circuits belong.

9. The multi-way switch of claim 2, wherein the radio frequency circuit of the wireless communication device logically comprises two transmitter integrated circuits and four receiver integrated circuits;

the radio frequency circuit physically comprises six independent circuit modules, and the six independent circuit modules comprise two first independent circuit modules and four second independent circuit modules; and each first independent circuit module comprises one transmitter integrated circuit, the transmitter integrated circuit comprises two transmitter circuits working at different frequency bands and are integrated to be coupled with one first port of a first independent circuit module to which the two transmitter circuits belong, and each second independent circuit module comprises one receiver integrated circuit, the receiver integrated circuit comprises two receiver circuits, and the two receiver circuits are integrated to be coupled with one second port of a second independent circuit module to which the two receiver circuits belong.

10. The multi-way switch of claim 1, wherein the multi-way switch is configured to be coupled with the radio frequency circuit and the antenna system to implement a preset function of the wireless communication device, and the preset function is a function of transmitting a sounding reference signal (SRS) through the four antennas in turn.

11. A radio frequency system, comprising an antenna system, a radio frequency circuit, and a multi-way switch coupled with the radio frequency circuit and the antenna system;

the multi-way switch comprising six throw (T) ports and four pole (P) ports, the six T ports comprising two first T ports supporting only a transmission function and four second T ports supporting only a reception function, and each of the two first T ports being coupled with all of the four P ports;

the antenna system comprising four antennas corresponding to the four P ports; and the multi-way switch being configured to implement a preset function of transmitting an sounding reference signal (SRS) through the four antennas in turn.

12. The radio frequency system of claim 11, wherein each of the four second T ports is coupled with one of the four P ports, and T ports at the same frequency band among the four second T ports are coupled with different P ports; and each of the four P ports is coupled with a corresponding antenna of the four antennas.

13. The radio frequency system of claim 11, wherein the four antennas comprise a first antenna, a second antenna, a third antenna, and a fourth antenna; and the first antenna, the second antenna, the third antenna, and the fourth antenna are antennas operable at a fifth generation new radio (5G NR) frequency band.

14. The radio frequency system of claim 11, wherein the four antennas comprise a first antenna, a second antenna, a third antenna, and a fourth antenna;

the first antenna and the fourth antenna are antennas operable at a long term evolution (LTE) frequency band and a 5G NR frequency band; and the second antenna and the third antenna are antennas only operable at the 5G NR frequency band.

15. The radio frequency system of claim 14, wherein the antenna system further comprises a first combiner and a second combiner, wherein the first combiner has a first port coupled with the first antenna, a second port coupled with a first receive path in LTE 4×4 multiple-input multiple-output (MIMO) configuration of the radio frequency system, and a third port coupled with a corresponding P port of the multi-way switch; and the second combiner has a first port coupled with the fourth antenna, a second port coupled with a second receive path in the LTE 4×4 MIMO configuration of the radio frequency system, and a third port coupled with a corresponding P port of the multi-way switch.

16. The radio frequency system of claim 14, wherein the antenna system further comprises a first SPDT switch and a second SPDT switch, wherein the first SPDT switch has a first port coupled with the first antenna, a second port coupled with a first receive path in LTE 4×4 MIMO configuration of the radio frequency system, and a third port coupled with a corresponding P port of the multi-way switch; and the second SPDT switch has a first port coupled with the fourth antenna, a second port coupled with a second receive path in the LTE 4×4 MIMO configuration of the radio frequency system, and a third port coupled with a corresponding P port of the multi-way switch.

17. The radio frequency system of claim 11, wherein the multi-way switch comprises forty-six field-effect transistors.

18. A wireless communication device, comprising an antenna system, a radio frequency transceiver, a radio frequency circuit coupled with the radio frequency transceiver, and a multi-way switch coupled with the radio frequency circuit and the antenna system;

the multi-way switch comprising six throw (T) ports and tour pole (p) ports, the six T ports comprising two first T ports, and each of the two first T ports being coupled with all of the four P ports; the two first T ports supporting only a transmission function;

the antenna system comprising four antennas corresponding to the four P ports; and the multi-way switch being configured to implement a preset function of transmitting an sounding reference signal (SRS) through the four antennas in turn.

19. The wireless communication device of claim 18, wherein the six T ports further comprise four second T ports;

each of the four second T ports is coupled with one of the four P ports, and T ports at the same frequency band among the four second T ports are coupled with different P ports;

each of the four P ports is configured to be coupled with a corresponding antenna of the four antennas; and the four second T ports support only a reception function.

20. The wireless communication device of claim 18, wherein the four antennas comprise a first antenna, a second antenna, a third antenna, and a fourth antenna;

the first antenna and the fourth antenna are antennas operable at an LTE frequency band and a 5G NR frequency band; and the second antenna and the third antenna are antennas only operable at the 5G NR frequency band.

* * * * *